United States Patent [19]

Grodinsky

[11] 4,162,457
[45] Jul. 24, 1979

[54] EXPANSION CIRCUIT FOR IMPROVED STEREO AND APPARENT MONAURAL IMAGE

[76] Inventor: Robert M. Grodinsky, 4448 W. Howard, Skokie, Ill. 60076

[21] Appl. No.: 866,021

[22] Filed: Dec. 30, 1977

[51] Int. Cl.² ............................................. H03F 3/68
[52] U.S. Cl. .................................. 330/295; 179/1 D; 330/124 R; 330/278; 333/14
[58] Field of Search ................... 179/1 G; 330/124 R, 330/132, 295, 278; 333/14

[56] References Cited

U.S. PATENT DOCUMENTS

| 3,229,038 | 1/1966 | Richter | 333/14 X |
| 3,895,191 | 7/1975 | Kogenezawa et al. | 179/1 G X |

*Primary Examiner*—Lawrence J. Dahl
*Attorney, Agent, or Firm*—Wallenstein, Spangenberg, Hattis & Strampel

[57] ABSTRACT

An expander circuit for expanding stereo signals comprises left and right channel variable gain stages whose gain varies in proportion to the amplitude of the control signals fed to the control inputs thereof; and left and right channel expansion control signal providing means for receiving respectively at least portions of the left and right channel signals and feeding expansion control signals to the control inputs of the variable gain stages. These control signals have amplitudes directly proportional to the amplitudes of the signals fed to the inputs of the expansion control signal providing means. The improvement in the circuit is the addition of a signal coupling network for coupling a portion of the left-right channel stereo image producing signal components to the input of the associated expansion control signal providing means and a much smaller porportion thereof to the expansion control signal providing means associated with the other channel. The coupling network responds differently to identical apparent monaural image producing signal components in each channel by feeding a larger proportion thereof to the input of the associated expansion control signal providing means. The coupling network is coupled to points of both amplifier channels which prevent the cross-coupling of a significant portion of the signals in each amplifier channel to the main signal path of the other amplifier channel.

18 Claims, 3 Drawing Figures

EXPANSION CIRCUIT FOR IMPROVED STEREO AND APPARENT MONAURAL IMAGE

BACKGROUND OF THE INVENTION

This invention relates to expander circuits in multi-channel amplifier systems used commonly, among other possible reasons, to re-establish the desired dynamic quality of the original signal components altered by compression and peak limiting operations carried out during a recording operation. A stereo sound system drives a left and a right speaker unit with left and right channel signals comprising what can be referred to as apparent monaural image-producing signal components having subsantially identical wave forms (in terms of amplitude and shape) and stereo image-producing signal components having substantially different wave forms. The substantially identical monaural image-producing left and right channel signal components produce an apparent sound source (which can be referred to as an apparent monaural sound image) midway between spaced speaker units. A significant percentage of stereo recordings surprisingly produce such an insufficient apparent monaural sound image that the center area in front of a listener positioned not far from the speaker appears to be acoustically weak. A stereo sound image is produced by these spaced speaker units when substantially different stereo image-producing signal components are fed to these spaced speaker units. In such case, an apparent sound image therefrom appears to be located substantially to one side or the other of the midway point between the speaker units. The ratio between the amplitudes of stereo image-producing signal components reproduced by these spaced speaker units determines the apparent location of the stereo sound image perceived by the listener. If a given stereo image-producing signal component is only reproduced by the left speaker unit, the apparent location of the stereo sound image produced thereby will be to the far left, whereas if the same signal component is also reproduced by the right speaker unit but to a lesser degree (as is commonly the case since complete stereo signal separation is uncommon), the apparent location of the stereo sound image is closer to the midway point between the speaker units in proportion to the degree to which the wave forms of the left and right stereo image-producing signal components approach near equal values.

Almost all recordings have their dynamic qualities alterned to some degree by means of compression and peak limiting. Therefore, for the most accurate sound reproduction expansion in the playback system is needed to re-establish the originally recorded signals. In a stereo playback system consisting of left and right channel recorded signals, the addition of an expander alters the stereo sound image produced by left and right speaker units because expansion alters the signal levels of the left and right channels to different degrees, depending on the ratio of the amplitudes of the stereo image producing signals thereof. Thus, for example, if the difference between the loudness of a louder left channel relative to the right channel is 6 db, after expansion of each channel separately the loudness difference could now be 12-20 db, and thus, the left channel would dominate to a greater extent, causing the apparent stereo image location to shift to the left. To avoid this effect and for economy sake, many expanders use only one DC control signal derived from the sum of the left and right signals to control both left and right channels. This sum signal is, by definition, a monaural signal. This method of expansion has two limitations. Firstly, since either channel controls the gain of both, if a signal is very low or absent from one side, the gain can still be raised by the signal of the other channel, thus allowing excessive noise to be heard in the absence of masking program signals. Secondly, if relatively fast time constants are used for the expansion, a reduced sense of stereo image results because the control signal is monaural.

My U.S. Pat. No. 3,980,964 describes an expander circuit which reduces distortion, noise and pumping effects while allowing fast accurate following of the program envelope. This results in a greater sense of realism than with slower designs since all aspects of the program, including fast transients are expanded. This expander circuit, in addition to the presence of a non-frequency selective variable gain stage and a fast acting expansion control signal producing circuit which is preferably an AC to DC converter circuit controlling the same, is provided with a high pass filter which filters out low frequencies, so that the converter circuit produce DC gain control signals reflecting the amplitude of the harmonics of the fundamental frequencies of the audio signal. The commercial form of this circuit incorporated in a stereo amplifier system, before the present invention was conceived, decreased the amount of stereo signal ratio modification caused by the expansion process by cross-coupling a fraction of each DC control signal produced by each AC to DC converter circuit to the control terminal of the variable gain stage of the other channel. Thus, each channel had a small gain control effect on the other channel so that, with this cross-coupling, the stereo image retained a better resemblance to that which would be produced by the original signals. (This stereo image improvement is achieved independently of the presence of the high pass filters described, which are responsible for the distortion, noise and pumping effect reducing the advantages of this circuit).

As previously indicated, many stereo recordings fail to produce a significant apparent monaural image to give a more realistic special effect to the listener. In using the cross-coupling of DC control signals to only moderately reduce the stereo separation in the amplifier channels just described to re-establish a more accurate stereo image, many recordings still produce a relatively poor apparent monaural image. While this apparent monaural image could be increased in the circuit just described by increasing the ratio of the cross-coupled DC control signals, such an increased cross-coupling of signals required to establish a significant apparent monaural image usually undesirably reduces the desired stereo separation so that the desired stereo image is not achieved.

Accordingly, an object of the present invention is to provide expansion control circuitry which cross-couples expansion control signals in a manner which both improves the stereo and the apparent monaural images produced by the multi-channel amplifier and sound system involved. Another object of the invention is to produce such an improved expansion circuit at a modest cost.

SUMMARY OF THE INVENTION

The present invention is a substantial improvement over the above described DC control signal mixing technique from the standpoint of simultaneously producing more realistic stereo and monaural images. Also, it produces unexpectedly a three-dimensional effect (i.e. a greater sense of depth as well as width) from only left and right speaker units.

These impressive results are achieved by the cross-coupling of the AC input signals to the AC to DC converter circuits previously described (or other expansion control signal providing circuit involved), with and without the presence of said high pass filters, rather than by cross-coupling the DC outputs thereof. Thus, a relatively small fraction, as for example, about 5–20%, and preferably about 10–15%, of only the stereo component of the AC input signal fed to the expansion control signal providing circuit associated with each amplifier channel is fed to the input of the expansion control signal providing circuit associated with the other channel. Also, the monaural component of the AC input signal in each channel is coupled to a greater degree than the stereo component thereof to the input of the associated expansion control signal providing circuit. The stereo image correcting and monaural image enhancing effect produced by the AC cross-coupling described occurs only if the time response of the expansion control signal providing circuit is short. In other words, the DC control signals produced by AC to DC converter circuits used as expansion control signal providing circuits must reflect the instantaneous changes of the amplitudes of the AC input signals. Such fast acting AC to DC converter circuits are disclosed in my U.S. Pat. Nos. 3,980,964 and 3,790,896.

Because the signals involved are AC signals, it is possible to provide circuitry which responds differently to the apparent monaural image-producing signal components and the stereo image-producing signal components, as described. In accordance with the preferred form of the invention, the circuit for accomplishing this result includes a voltage-divider impedance network which interconnects corresponding low impedance points of the two amplifier channels involved. These low impedance points are, most advantageously, the emitter portion of emitter-follower circuits which normally have low impedance points at the emitters of the transistors thereof. The voltage divider impedance network preferably comprises identical outer impedance sections coupled between the low impedance points and the input terminals to the expansion control signal providing circuits, such as the inputs to the high pass filters or AC to DC circuits referred to, and a center impedance section of an impedance value many times greater than the outer impedance sections and interconnecting the input terminals of the expansion control signal providing circuits. It can be shown that when signals having wave forms with substantially identical amplitude, phase and shape (i.e. monaural image-producing signals) are present at the outermost terminals of this network, no current flows beween these terminals. The center impedance section of the network then acts like an almost infinite impedance isolating the outer sections of the network and providing a different voltage division along the network for stereo and monaural signals to that a higher proportion of the identical monaural signals appearing at each low impedance terminal referred to is coupled to the input of the associated expansion control signal providing circuit than for stereo signals present at these terminals. Also, the low impedance points to which the ends of the impedance network are connected result in a voltage division along the network for stereo signals which produces a substantially zero voltage (with respect to chassis ground) at these points, so that the network de-couples the stereo signal in each channel from that portion of the other channel coupled to the adjacent end of the impedance network, such as the input to the associated variable gain stage.

DESCRIPTION OF EXEMPLARY EMBODIMENT OF THE INVENTION

Figure 1:
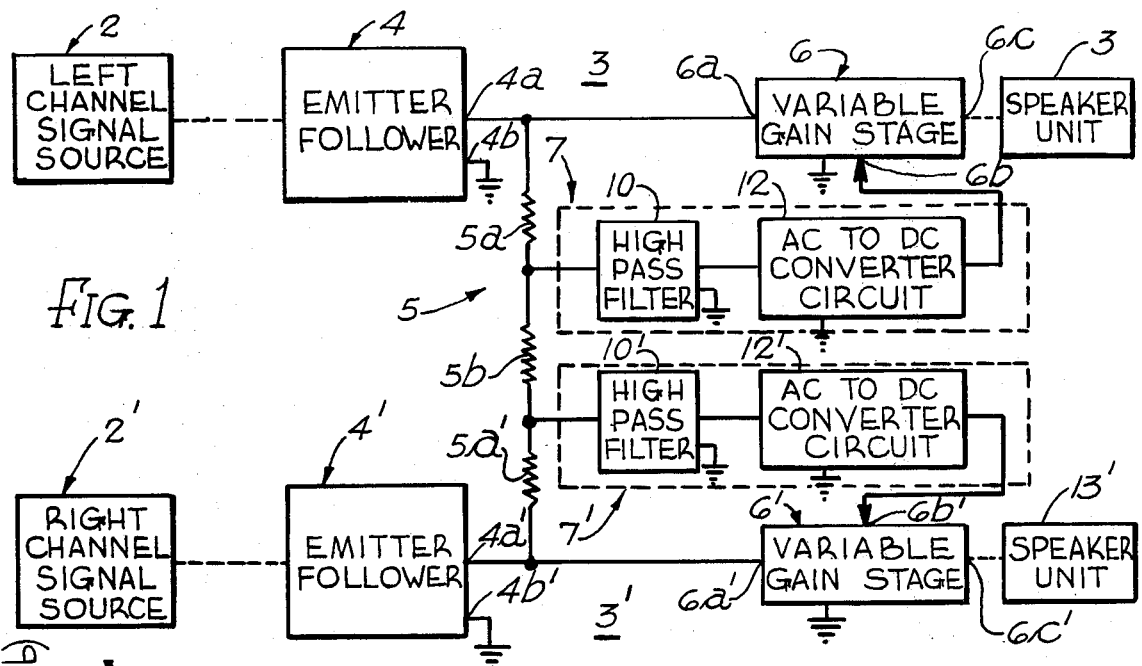
FIG. 1 is a block diagram of a preferred form of the expansion circuit of the invention.

Referring now more particularly to the exemplary block diagram of FIG. 1, shown therein are signal sources 2–2' for left and right amplifier channels 3–3' of a stereo amplifier system. These signal sources may be FM signal detector circuits, disc record pick-up units, tape pick-up units, or the like, which produce signals having what has been previously referred to as apparent monaural image-producing signal components, and stereo image-producing signal components. As previously indicated, apparent monaural image-producing signal components have wave forms which have substantially similar or identical amplitude and shape, (and desirably also the same phase) and stereo image-producing signal components have wave forms which have substantially dissimilar amplitude and/or shape.

Figure 2:
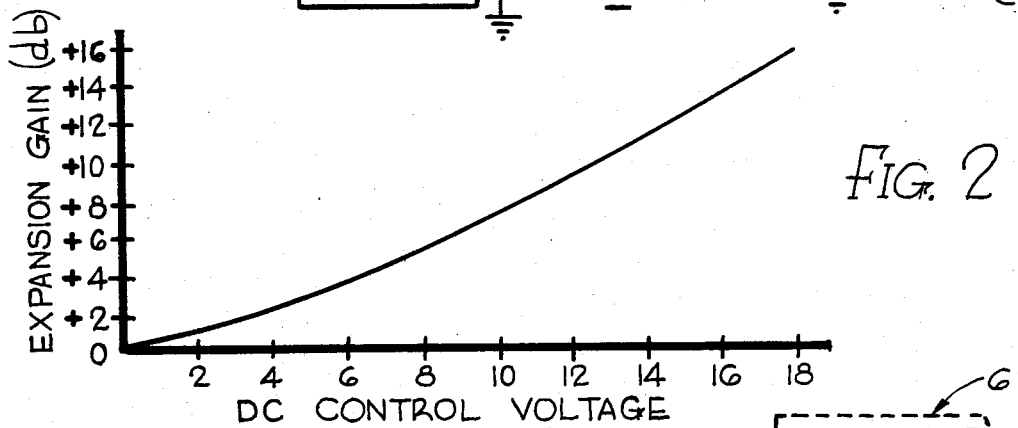
FIG. 2 shows the degree of gain expansion achieved by the variable gain stages shown in FIG. 1 from the various expansion control signals indicated.
Figure 3:
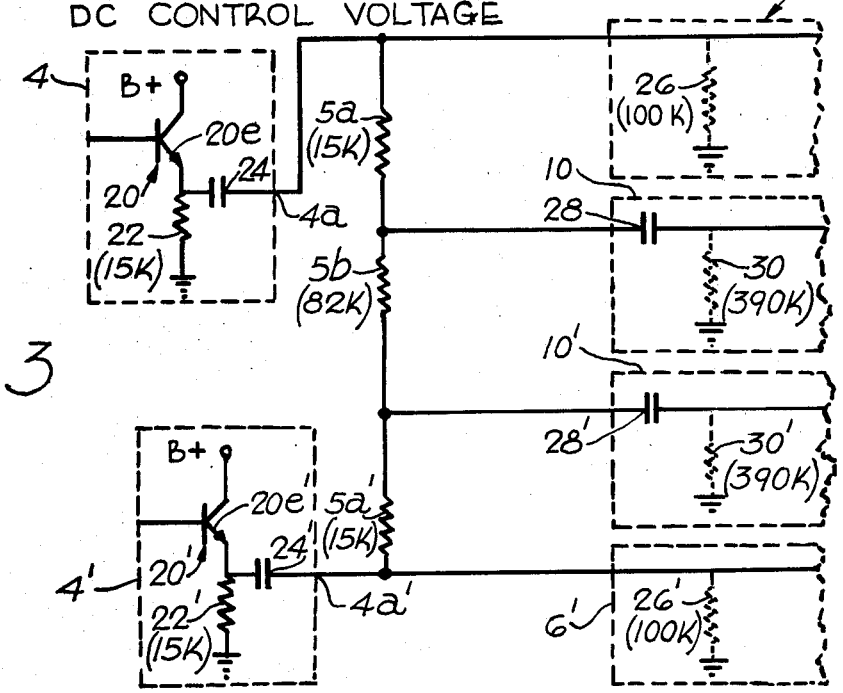
FIG. 3 is an exemplary circuit diagram of the emitter-follower circuits and the associated voltage divider network interconnecting the emitter circuit outputs and inputs of the high pass filters shown in block form in FIG. 1.

The signal sources 2–2' are respectivey coupled directly or indirectly through amplifiers (not shown) to circuits 4–4' which provide a very low impedance between their output terminals 4a–4a' and a reference point, like chassis ground, to which their terminals 4b–4b' are connected. In the exemplary circuit illustrated, the circuits 4–4' are emitter-follower circuits where the terminals 4a–4a' are coupled to the emitter portions of the transistors therein, as shown in FIG. 3 to be described. The output terminals 4a–4a' of the emitter-follower circuits 4–4' are shown connected respectively to the input termials 6a–6a' of non-frequency selective variable gain stages 6–6'. The variable gain stages 6–6' can take a variety of forms. Thus, they can each be a variable impedance network, like the network 2 shown in FIG. 9 of my U.S. Pat. No. 3,980,964 (which has a variable gain less than 1), or more preferably can be a more conventional variable gain amplifier (which has a variable gain more than 1). In either event, the variable gain stages 6–6' act as expansion circuits where the gain thereof is directly proportional to the amplitude of expansion control signals fed to the input control terminals 6b–6b' thereof, as illustrated by FIG. 2. In the present exemplary circuit in FIG. 1, these expansion control signals are DC voltages fed thereto from expansion control signal providing circuits 7–7' which, most preferably, include high pass filters 10–10' and AC to DC converter circuits 12–12' which respectively may be like the high pass filter circuits3–3' and AC to DC converter circuits 4–4' shown in FIGS. 5 and 6 of my U.S. Pat. No. 3,980,964. However, if one wishes not to utilize the advantages of the invention of this patent, the high pass filters 10-10' may be omitted. Where the variable gain stages 6-6' are of the type shown in FIG. 9 of this patent, the AC to DC converter circuits 12-12' would not be needed and the expansion control signal producing circuits 7-7' would, in effect, be the signal cross-coupling circuit 5 to be described, which interconnects the low impedance terminals 4a-4a'.

The output terminals 6c-6c' of the variable gain stages 6-6' may be coupled through power amplifiers to left and right hand speaker units 13—13' which would normally be placed respectively at left front and right front portions of a room in front of the seating area of the listener or listeners involved. In a four-channel amplifier system, the circuit shown in FIG. 1 could be duplicated for left rear and right rear speaker units.

In accordance with the present invention, the cross-coupling circuit 5 provides different degrees of coupling and cross-coupling of the monaural and stereo signals from each channel to the inputs of the expansion control signal providing circuits. Thus, identical monaural signals in the amplifier channels are, most advantageously, coupled through this circuit 5 to the input terminals of the associated expansion control signal providing circuits 7-7' to a greater degree than the stereo signals are coupled thereto, and a portion of the stereo signal components in each amplifier channel are cross-coupled to the input terminal of the expansion control signal providing circuit associated with the other channel. For example, from about 5 to 20%, and more preferably from about 12 to 15%, of the stereo image-producing signal components coupled to the input terminal of expansion control signal providing circuit 7 or 7' associated with one amplifier channel is cross-coupled to the input terminal of the expansion control signal providing circuit associated with the other amplifier channel. Also, the stereo signals in each amplifier channel are de-coupled from the other amplifier channel because of the low impedance of the emitter-follower output terminals 4a-4a'.

As previously indicated, the AC to DC converter circuits 12-12' must, for the advantages of the invention to apply, respond quickly to changes in amplitude of the input signal components, as is the case also with the circuit shown in my U.S. Pat. No. 3,980,964. (FIG. 8 of this patent and the description thereof indicates a desired speed of response of the output of the AC to DC converter circuits resulting from a relatively long duration audio signal of fixed amplitude suddenly applied to and suddenly removed from the AC to DC converter circuits.)

While the cross-coupling circuit 5 now to be described may have other circuit configurations for producing the functions just described, it is most preferably a voltage divider network comprising identical outer resistors 5a-5a' respectively connected between the low impedance emitter-follower circuit terminals 4a-4a' and the input terminals 10a-10a' of the high pass filters 10-10' (where the high pass filters are utilized) or the input terminals of the AC to DC converter circuits 12-12' in the absence of said filters. A central cross-coupling resistor 5b is provided of a substantially higher resistance value than the resistors 4a-4a'. For example, in one commercial form of the circuit, the resistors 4a-4a' were 15,000 ohms and the cross-coupling resistor was 82,000 ohms. However, the actual values and effects of these resistors depend upon the particular effective circuit input impedances of the circuits to which the various points of the voltage divider network are connected. It was found that such a voltage divider network responds differently to the monaural and stereo signals as described.

In order to explain the operation of the voltage divider network, reference should now be made to FIG. 3 which shows exemplary circuits for the emitter follower circuits 4-4' and the equivalent input circuits for the variable gain stages 6-6' and the high pass filters 10-10'. As there shown, the emitter follower circuits 4-4' respectively include NPN transistors 20-20' whose emitters 20e-20e' are connected through resistors 22-22' to ground. Capacitors 24-24' connect the emitters 20e-20e' respectively to the outer ends of voltage divider network 5 and also to the ungrounded ends of impedances 26-26' representing the equivalent input impedances of the variable gain stages 6-6'. The upper and lower ends respectively of cross-coupling resistor 5b of the voltage divider network 5 are shown respectively coupled through capacitors 28-28' to impedances 30-30' representing the equivalent input impedances of the high pass filter circuits 10-10'.

Exemplary values of the various impedances shown in FIG. 3 are as follows:
resistors 5a and 5a'—15,000 ohms
resistor 5b—82,000 ohms
resistors 22 and 22'—15,000 ohms
resistors 26 and 26'—100,000 ohms
resistors 30 and 30'—390,000 ohms
capacitors 24 and 24'—10 microfarads
capacitors 28 and 28'—0.0047 microfarads For identical signals appearing simultaneously at the outer ends of resistors 5a-5a', which would be the case with monaural signals, there can obviously be no flow of current between these points since there is no potential difference therebetween when, as is usually the case with monaural signals in the amplifier channels, they are approximately in phase with one another. In such case, no current from these monaural signals will flow in the cross-coupling resistor 5b which makes this resistor act like an infinite impedance connected to chassis ground. Accordingly, for given monaural signals at the output terminal 4a or 4a' of the emitter follower circuit 4 or 4', the magnitude of the signal coupled across the equivalent input impedance 26 or 26' of the associated variable gain stage 6 or 6' is determined by the following equation:

$$Em = Am \times \frac{390,000}{390,000 + 15,000} = Am \times \frac{390}{405} = .96\, Am$$

where AM equals the amplitude of the monaural signal involved.

(This equation assumes that the effective infinite impedance to ground referred to, shunted by the 390,000 ohms resistor 30 connected to chassis ground, acts like a single 390,000 resistor replacing the same.)

For stereo signals which are dissimilar signals in the two channels, the voltages or currents produced by the same are coupled to a lesser degree to the input of the associated high pass filter and are cross-coupled to the input of the high pass filter associated with the other channel to only a modest degree as, for example, with a cross-coupling ratio falling in the range of about 5 to 20% and, preferably, in the range of about 10 to 15%. Since stereo signals present at the opposite ends of the voltage divider resistors 5a-5a' are substantially dissimilar signals, current will flow into the cross-coupling resistor 5b as determined by its value and that of resistor 5a or 5b. Therefore, the voltage divider network does not act to de-couple these signals from the various points of the voltage divider network, and so there will be at the input of each high pass filter signals originating both from the output terminal of the emitter follower of the associated channel and the output terminal of the emitter follower of the other channel. The stereo signal voltage Ecc cross-coupled from the input of high pass filter 10 or 10' to the input of the other of same through the cross-coupling resistor 5b and resistor 5a or 5a' is determined by the following equation:

$$Ecc = Es \frac{15,000}{15,000 + 82,000} = Es \times \frac{15}{97} = .15\, Es$$

where Es equals the stereo signal at the input of filter 10 or 10'.

The stereo signal voltage Ec directly coupled from the output of emitter follower circuit 4a or 4a' to the ungrounded end of the equivalent input impedance 30 or 30' of the associated high pass filter is determined by the following equation:

$$Ec = Es' \frac{77,700}{77,700 + 15,000} = As \frac{77.7}{92.7} = .84\, As$$

where Es' equals the stereo signal at terminal 4a or 4a'. The 77,700 ohms is the net resistance of the resistor 30 or 30' in parallel with resistors 5b and 5a or 5a', assuming further that the emitter circuit resistance is of such a small value (typically under 300 ohms) in comparison to 15,000 ohms that it acts like an effective ground. This effective ground acts to prevent coupling of stereo signals between the inputs of the variable gain stages. Thus, the equation for the stereo voltage Ecc' coupled between one end of the voltage divider network 5 and the other end thereof is as follows:

$$Ecc' = Es \frac{200 \text{ (assumed emitter circuit impedance)}}{15,000 + 77,000} = .002\, Es$$

where Es equals the stereo signal at terminal 4a or 4a'.

It can thus be seen that the amount of the monaural signals coupled from the output terminal 4a or 4a' to the input of the associated high pass filter 10 or 10' is greater than the amount of the stereo signals coupled to the input of the associated high pass filter 10 or 10', so that the DC control signal developed by the AC to DC converter circuit associated therewith will be affected to a higher degree by a monaural signal of a given amplitude than by a stereo signal of the same amplitude. Also, a small but significant portion of the stereo signal at the input of high pass filter 10 or 10' originating in the associated channel is cross-coupled to the input of the other filter, but practically no portion thereof is coupled to the input of the variable gain stage of the non-associated channel. The voltage divider network 5 thus produces a desired reduced amount of stereo signal separation in the amplifier channels together with a desired increase in the monaural signals therein to eliminate a weak sound image midway between the speaker units.

It should be understood that numerous modifications may be made in the most preferred form of the invention shown in the drawings without deviating from the broader aspects of the invention. For example, while the cross-coupling of stereo signals between the inputs of the variable gain stages is best achieved by use of a voltage divider network 5 coupled between the emitter portions of emitter-follower circuits 4–4' driving variable gain stages 6–6', isolation between the inputs of the variable gain stages could be achieved by separating the inputs of the variable gain stages from the network 5 altogether as, for example, by use of separate emitter-follower circuits in each channel (not shown). Also, the signals feeding the voltage divider network 5 less desirably could be obtained completely from the output of the variable gain stages, or partially therefrom as by voltage adding or subtracting feedback connections between the output of variable gain stages 6–6' and the inputs to high pass filters 10–10'.

I claim:

1. An expander circuit for a multi-channel amplifier system including left and right amplifier channels respectively driving left and right speaker units, each channel including a variable gain stage therein whose gain varies in direct proportion to the amplitude of control signals fed to control signal input terminals thereof, said expander circuit comprising left and right expansion control signal providing means having inputs for receiving respectively left and right amplifier channel signals and output terminals connected respectively to said control signal input terminals of said variable gain stages of said left and right amplifier channels, at which output terminals the expansion control signals respectively appear in proportion to the amplitudes of the sum of the signal components fed to said inputs, the improvement comprising signal coupling circuit means for coupling the signals of said amplifier channels to the input terminals of said expansion control signal providing means, said signal coupling circuit means including respective means associated with said channels for respectively coupling at least a portion of the signals therein having substantially different waveforms to the input terminals of the expansion control signal providing means of the associated channels and for cross-coupling a substantially lesser proportion of the same to the input terminal of the expansion control signal providing means of the non-associated channels, whereby the original signal separation of the two amplifier channels is substantially maintained in spite of said expansion.

2. The expander circuit of claim 1 wherein there is provided isolating means for preventing said cross-coupled signals fed to the latter expansion control signal providing means from being also cross-coupled to the input of the variable gain stage of the latter amplifier channel.

3. The expander circuit of claim 1 wherein the ratio of the signals having substantially different waveforms in said respective channels cross-coupled to the input terminals of the expansion control signal providing means of the non-associated channels to that coupled to the input terminal of the expansion signal providing means of the associated channels is in the range of from about 5 to 20%.

4. The expander circuit of claim 3 wherein said ratio is in the range of from about 10 to 15%.

5. The expander circuit of claim 1 wherein said signals of substantially different waveform are coupled to said expansion control signal providing means from variable gain stage driving points of said amplifier channels which prevent cross-coupling of signals in each channel to the input of the variable gain stage of the other channel.

6. The expander circuit of claim 5 wherein said points are the emitter connected portions of emitter-follower circuits.

7. The expander circuit of claim 1 wherein said coupling circuit means couples a greater percentage of substantially identical signals in said respective amplifier channels to the inputs of the expansion control signal providing means of the associated channels than for said signals of substantially different waveforms, to enhance an apparent monaural image produced between said left and right speaker units.

8. The expander circuit of claim 1 wherein said coupling circuit means comprises a voltage divider network connected between relatively low impedance points of said amplifier channels, said voltage divider network comprising three series connected sections, the outer sections being connected between said low impedance points of said amplifier channels and the respective input terminals of said expansion control signal providing means, and a center section interconnecting said input terminals.

9. The expander circuit of claim 8 wherein said center section of said voltage divider network has an impedance value many times greater than the outer section thereof.

10. The expander circuit of claim 9 wherein the equivalent input impedances of said expansion control signal providing means are of a value many times greater than the value of the impedances of said center section of said voltage divider network.

11. The expander circuit of claim 8 wherein said low impedance points are in the emitter connector portions of emitter-follower circuits.

12. The expander circuit of claim 8 wherein said expander control signal providing means includes an AC to DC converter circuit which produces DC signals closely and substantially instantaneously following the change in amplitude of the signals fed from said amplifier channels to the inputs thereof, said variable gain stages being responsive to the DC control signals fed to the control signal input terminals thereof.

13. In a circuit for expanding stereo input signals in left and right stereo amplifier channels and including stereo input signal receiving left and right channel variable gain means, each of which has a gain proportional to the amplitude of a control signal fed to a control input thereof, and a left and right channel expansion control signal providing means responsive respectively to the input signals in said left and right channels for producing control signals respectively fed to the control inputs of the associated left and right variable gain means, said control signals having amplitudes directly proportional to the amplitude of the sum of the proportion of the input signals fed to the associated expansion control signal providing means, the improvement comprising coupling means for coupling a portion of each input signal component fed to the input of each associated expansion control signal providing means to the input of the other expansion control signal providing means, and isolating means for preventing the cross-coupling of the input signals from each channel from the variable gain means of the associated channel to the input of the variable gain means of the other channel.

14. The circuit of claim 13 wherein said coupling means is a voltage divider network extending between corresponding low impedance points of said amplifier channels and having similar impedance value outer sections respectively coupled between said low impedance points and the inputs of said expansion control signal providing means and a center section interconnecting said inputs and being many times larger in impedance value than said outer sections of the voltage divider network.

15. In a circuit for expanding stereo input signals in left and right stereo amplifier channels and including stereo and monaural signal components, left and right channel stereo signal receiving variable gain means each responsive to the amplitude of control signals fed to the control input thereof by varying the gain thereof in accordance with the amplitude of the control signals fed thereto, and left and right channel expansion control signal providing means responsive respectively to the input signals in said left and right channels for producing signals respectively fed to the control inputs of the associated left and right variable gain means, said control signals having amplitudes directly proportional to the amplitude of the sum of the proportion of the input signals fed to the associated expansion control signal providing means, the improvement comprising: coupling circuit means for coupling the monaural and stereo input signal components in said channels to the left and right expansion control signal providing means and comprising means for coupling the stereo signal components of the input signal in each channel to the inputs of both of said expansion control signal producing means, the degree of such coupling being to a greater degree to the input of the expansion control signal producing means of the associated channel than to the input of the expansion control signal providing means associated with the other channel, and for coupling to a greater degree than the stereo signal components in each channel the monaural signal components in each channel to the input of the associated expansion control signal providing means, and isolation means for preventing the cross-coupling of the stereo signal components in each of the channels to the input of the variable gain means associated with the other channel.

16. The circuit of claim 15 wherein said expansion control signal providing means of each channel includes an AC to DC converter circuit for generating a DC expansion control signal from the sum of the signal components fed thereto.

17. The circuit of claim 15 wherein said isolation means is an emitter-follower circuit.

18. The circuit of claim 15 wherein said expansion control signal providing means is a circuit which responds substantially instantaneously to changes in amplitude of the input signals thereto.

* * * * *